United States Patent [19]

Shibata et al.

[11] Patent Number: 5,187,441
[45] Date of Patent: Feb. 16, 1993

[54] PORTABLE INFORMATION APPARATUS FOR SENSING BATTERY VOLTAGE DROP

[75] Inventors: Koichi Shibata; Toshitaka Fukushima; Hiroyuki Watanabe; Shinichiro Miyahara; Osamu Imagawa, all of Tokyo, Japan

[73] Assignee: Seiko Instruments Inc., Japan

[21] Appl. No.: 625,861

[22] Filed: Dec. 11, 1990

[30] Foreign Application Priority Data

Dec. 13, 1989 [JP] Japan .................................. 1-324511

[51] Int. Cl.[5] .......................................... G01N 27/416
[52] U.S. Cl. .................................... 324/426; 324/436; 340/636
[58] Field of Search .................. 324/426, 436; 320/48; 340/636; 364/550

[56] References Cited

U.S. PATENT DOCUMENTS

| 4,021,718 | 5/1977  | Konrad              | 320/48  |
| 4,080,560 | 3/1978  | Abert               | 340/636 |
| 4,725,784 | 2/1988  | Peled et al.        | 340/636 |
| 4,849,681 | 7/1989  | Munnig Schmidt et al. | 320/48 |
| 4,958,127 | 9/1990  | Williams et al.     | 320/48  |
| 4,977,393 | 12/1990 | Arnold et al.       | 340/636 |
| 5,027,294 | 6/1991  | Fakruddin et al.    | 324/426 |
| 5,036,284 | 7/1991  | Cichanski           | 320/48  |

Primary Examiner—Jack B. Harvey
Assistant Examiner—Maura K. Regan
Attorney, Agent, or Firm—Bruce L. Adams; Van C. Wilks

[57] ABSTRACT

The portable information apparatus has a battery, a boosting circuit for boosting a voltage of the battery, a battery voltage detector for detecting a voltage level of the battery, an oscillating circuit for generating CPU clock and a counting circuit for counting the interval from the start of the oscillation of the CPU clock to the time when it becomes stable. The apparatus negates the output of the battery voltage detector during the interval counted by the counting circuit so that it can prevent the monitoring of the battery voltage lowering in the time of usual performance from influencing of the battery potential drop due to the transient current at the start of the performance of the boosting circuit and the oscillating circuit.

9 Claims, 2 Drawing Sheets

PORTABLE INFORMATION APPARATUS FOR SENSING BATTERY VOLTAGE DROP

BACKGROUND OF THE INVENTION

1. Field of the Invention

The present invention relates to a portable information apparatus which can monitor the drop of the battery voltage accurately.

2. Description of the Prior Art

Conventionally, portable information apparatuses utilize a battery in the electric power source and provide a battery voltage detector (BLD) to detect a voltage level of the battery. Further, portable information apparatuses add an integrating circuit such as a CR or the like in the input of the BLD in order to suppress the influence of the battery potential drop due to the transient current at the start of the performance of the boosting circuit and the oscillating circuit. The integrating circuit added to the input of the BLD requires a large time constant so as to mask the battery potential drop at the start of operation of the boosting circuit and the oscillating circuit. As a result, there is the possibility of failing to detect the battery potential drop which is necessary to be primarily recognized. That is, due to the addition of the integrating circuit to the input of the BLD, there is a problem that the battery voltage detection becomes less sensitive.

SUMMARY OF THE PRESENT INVENTION

An object of the present invention is to provide a portable information apparatus which suppresses the influence of the battery potential drop due to the transient current at the start of operation of the boosting circuit and the oscillating circuit and which detects the battery potential drop during the time of usual operation.

Another object of the present invention is to provide a portable information apparatus which can detect the drop of the battery voltage accurately.

To realize the above objects, the portable information apparatus of the present invention provides a signal for indicating the interval from the start of the oscillation of the CPU clock to the time when it becomes stable, and negates the output signal of the BLD by utilizing the signal.

DESCRIPTION OF THE PREFERRED EMBODIMENTS

Now the present invention will be explained in detail with reference of the embodiments thereof shown in the attached drawings.

Figure 1:
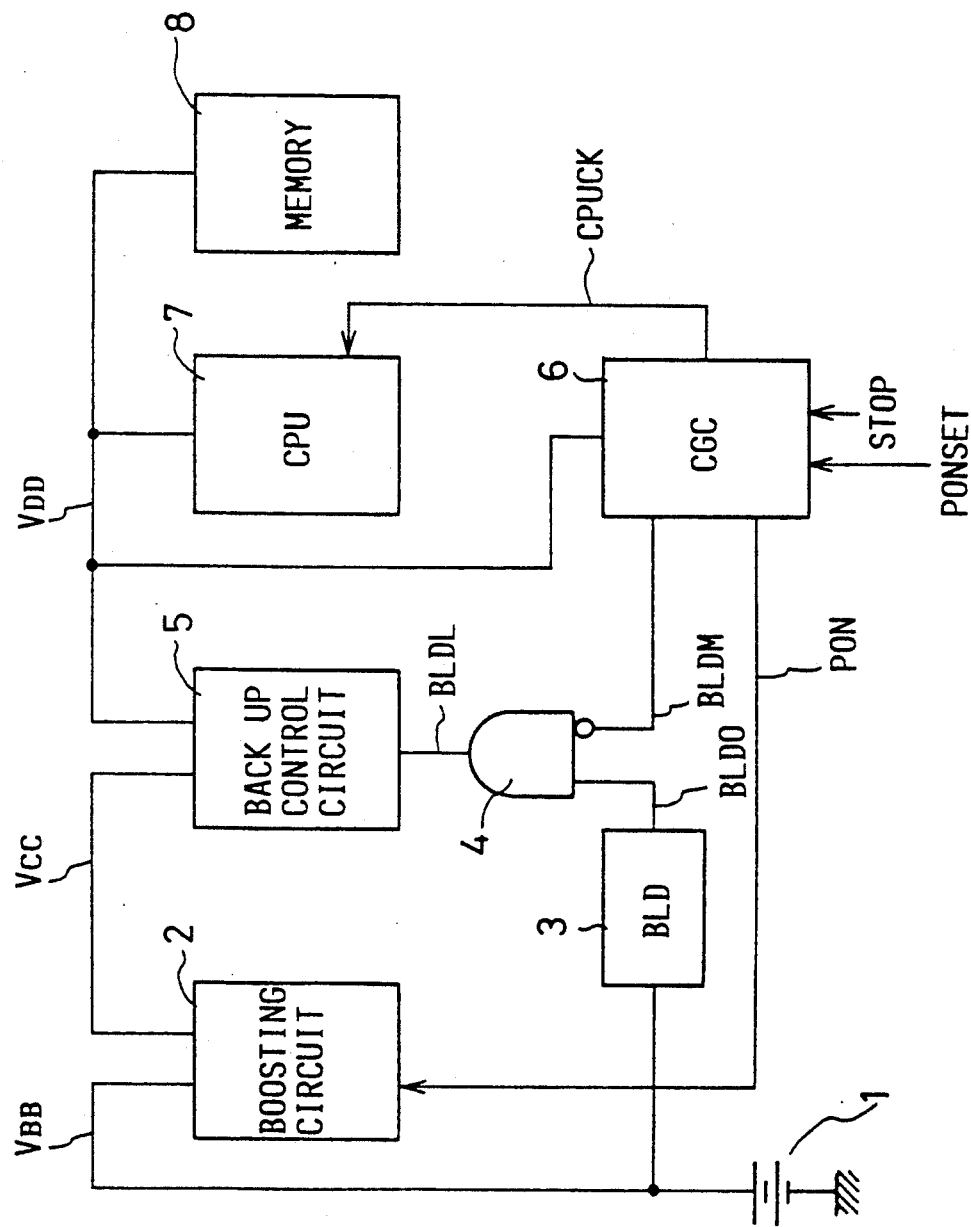
FIG. 1 is a block diagram of a portable information apparatus the present invention.

FIG. 1 is a block diagram of a portable information apparatus embodying the present invention.

A main battery 1 is connected to a boosting circuit 2 and a BLD 3. The boosting circuit 2 boosts a voltage $V_{BB}$ of the main battery 1 into $V_{CC}$. A back-up control circuit 5 inputs the voltage $V_{CC}$ and outputs a voltage $V_{DD}$ which becomes the driving voltage of the whole apparatus. An output or detection signed BLDO of the BLD 3 is connected to a gate 4 together with an output signal BLDM. An output signal BLDL of the gate 4 is connected to the back up control circuit 5. An output control processing unit or CPUCK of a clock generating circuit (CGC 6) is connected to a CPU 7. An output PON of the CGC 6 is connected to the boosting circuit (described hereinafter) 2.

The CGC 6 controls an oscillating circuit due to input signals PONSET and STOP, and generates signals of CPUCK, BLDM and the PON signal. The boosting circuit 2 boosts the voltage $V_{BB}$ of the main battery 1 when PON is "1". At the rising of PON, a transient current flows in the boosting circuit 2.

The BLD 3 monitors the voltage $V_{BB}$ of the main battery 1 and outputs BLDO which becomes "0" when the voltage $V_{BB}$ of the main battery 1 is lower than a certain threshold voltage.

The back-up control circuit 5 has a sub battery and backs up a memory 8 when the BLD 3 detects the voltage abnormality of the main battery 1. When BLDL becomes "0", it converts $V_{CC}$ into a voltage of the sub battery, outputs $V_{DD}$ based on the voltage of the sub battery and inhibits the select of the memory 8.

Figure 2:
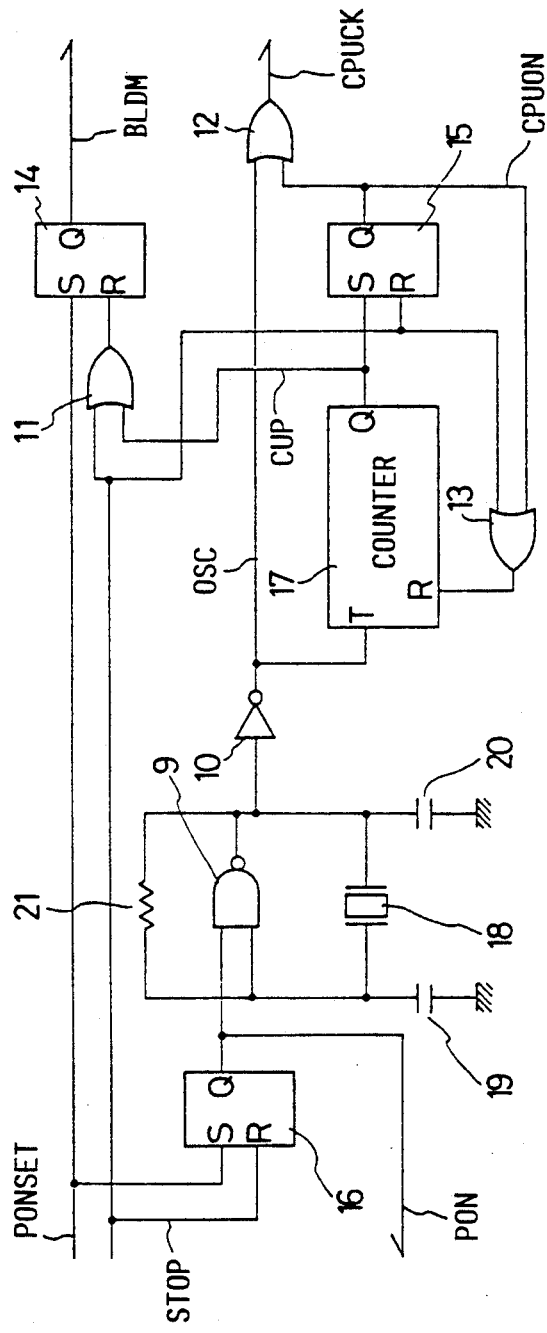
FIG. 2 a schematic diagram of a clock generating circuit of the portable information apparatus illustrated in FIG. 1.

FIG. 2 is a schematic diagram of the CGC 6 shown in FIG. 1.

The input signal PONSET is connected to each set terminal of RS F/F 14 and 16. The input signal STOP is connected to each reset terminal of RS F/F 15 and 16 and each input terminal of gates 11 and 13.

The oscillating circuit, which comprises gates 9, 10, a quartz 18, capacitors 19, 20 and a resistor 21, is controlled in its oscillation by the input signal PON of the gate 9. An output clock signal OSC of the oscillating circuit is connected to a counter 17 and a gate 12.

The counter 17 counts a period from the start of the oscillation until the OSC signal becomes stable. The counted up output signal CUP is connected to a reset terminal of the RS F/F 14 through the gate 11 and to a set terminal of the RS F/F 15. An output signal CPUON of the RS F/F 15 is connected to gates 12, 13. The gate 12 outputs a CPUCK, signal the RS F/F 14 outputs the PON signal and the RS F/F 16 outputs PON.

In the following, the operation of the CGC 6 will be explained.

When the input signal PONSET becomes "1", PON and BLDM become "1" so that the oscillating circuit starts oscillating and outputs OSC. The counter 17 starts counting when it inputs OSC. When the oscillation becomes stable, the counter 17 counts up and turns the output signal CUP into "1". As a result, the output signal BLDM of the RS F/F 14 is reset and the output signal CPUON becomes "1". When the CPUON becomes "1", the CPUCK is output and the counter 17 is reset.

When the input signal STOP becomes "1", the PON and CPUON are reset and the oscillating circuit stops its oscillation.

Figure 3:
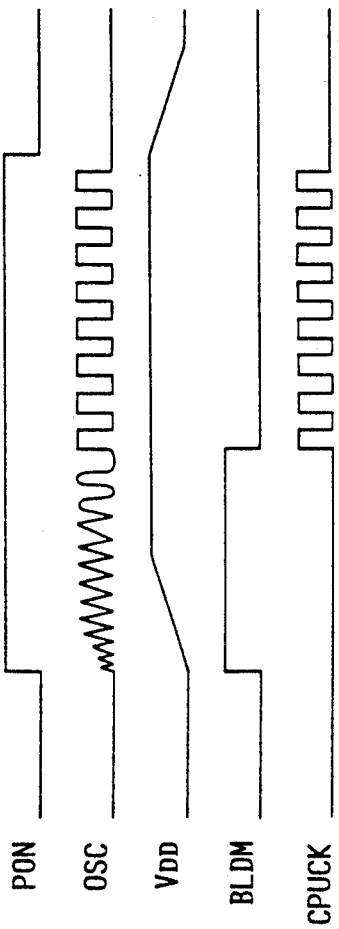
FIG. 3 is a timing chart diagram in the clock generating circuit illustrated in FIG. 2.

FIG. 3 is a timing chart diagram of the clock generating circuit shown in FIG. 2.

When PON becomes "1", the oscillating circuit starts oscillating and the output clock signal OSC of the oscillating circuit becomes stable after a short period. As shown in FIG. 3, the clock signal OSC initially has an unstable oscillating state at the start of oscillation followed by a stable oscillating state. When PON becomes "0", the oscillating circuit stops its oscillation.

When the boosting circuit 2 inputs PON which becomes "1", the boosting circuit 2 boosts the voltage $V_{BB}$ of the main battery 1 so that the voltage $V_{DD}$ rises gradually from $V_{BB}$ and holds the stable voltage potential after the short period. Further, $V_{DD}$ starts dropping when PON becomes "0" and returns to the voltage potential of $V_{BB}$.

BLDM holds "1" from the rising of PON until time when the OSC and $V_{DD}$ become stable.

CPUCK is outputted in the interval from the fall of the BLDM signal to the point where PON becomes "0".

In the present invention, as has been explained above, the gate 4 is negated by providing the BLDM equal to "1" during the interval from the start of oscillation of the CPU clock to the time when the oscillation becomes stable, so that it inhibits from inputting the output signal BDLO of the BLD 3 into the back-up control circuit 5. So the apparatus which does not give influence to the monitoring of the battery voltage lowering during the time of usual operation can be constructed.

What is claimed is:

1. A portable apparatus which generates a CPU clock signal only at the time of operation of a CPU and utilizes a boosted battery voltage as a driving voltage of the apparatus, said apparatus comprising:
   a battery for outputting a voltage;
   boosting means for boosting the voltage of said battery;
   voltage detecting means for detecting a voltage level of said battery and outputting a signal to indicate whether said voltage level is lower than a threshold voltage
   clock generating means including oscillating means for generating a CPU clock signal and counting means for counting an interval from the start of the oscillation of said oscillating means to the time when said oscillation becomes stable;
   a back-up control circuit connected between said boosting means and said CPU and responsive to said output signal of said voltage detecting means for applying back-up power to said CPU; and
   negating means for negating said output signal of said voltage detecting means during said interval counted by said counting means, said negating means comprising means for inhibiting application of said output signal of said voltage detecting means to said CPU during said interval counted by said counting means.

2. An apparatus powered during use by a battery which outputs a variable voltage, comprising: a central processing unit powered by the output voltage of the battery; oscillating means powered by the battery output voltage for generating a clock signal and applying same to the central processing unit, the clock signal having an unstable oscillating state at the start of oscillation followed by a stable oscillating state; voltage detecting means for detecting the level of the battery output voltage and producing a detection signal indicative of the voltage level; control means responsive to the detection signal for controlling the level of voltage applied to the central processing unit; and circuit means for inhibiting the application of the detection signal to the control means at the start of oscillation of the oscillating means when the clock signal has an unstable oscillating state.

3. An apparatus according to claim 2; including a memory connected to the central processing unit and powered by the battery output voltage.

4. An apparatus according to claim 2; wherein the control means includes a back-up battery for applying a back-up voltage to the central processing unit.

5. An apparatus according to claim 2; wherein the circuit means comprises counting means driven by the clock signal for counting an interval from the start of oscillation of the oscillating means to a time when the clock signal has a stable oscillating state and producing an output signal having one logic state during the interval and another logic state at the end of the interval, and means responsive to the output signal of the counting means for inhibiting the application of the detection signal when the output signal has said one logic state and for applying the detection signal to the control means when the output signal has said another logic state.

6. An apparatus according to claim 5; including boosting means connected between the battery and central processing unit for boosting the battery output voltage.

7. An apparatus according to claim 6; wherein the boosting means is connected between the battery and control means.

8. An apparatus according to claim 5; including a memory connected to the central processing unit and powered by the battery output voltage.

9. An apparatus according to claim 5; wherein the control means includes a back-up battery for applying a back-up voltage to the central processing unit.

* * * * *